United States Patent
Nguyen et al.

(10) Patent No.: US 6,284,052 B2
(45) Date of Patent: *Sep. 4, 2001

(54) IN-SITU METHOD OF CLEANING A METAL-ORGANIC CHEMICAL VAPOR DEPOSITION CHAMBER

(75) Inventors: Tue Nguyen; Lawrence J. Charneski, both of Vancouver, WA (US)

(73) Assignees: Sharp Laboratories of America, Inc., Camas, WA (US); Sharp Kabushiki Kaisha, Osaka (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/136,881

(22) Filed: Aug. 19, 1998

(51) Int. Cl.$^7$ ................. B08B 3/12; B44C 1/22
(52) U.S. Cl. ................. 134/1; 156/646; 216/67; 438/711; 438/905
(58) Field of Search .......... 134/1, 1.1; 156/646; 216/67; 438/711, 905; 427/255.6

(56) References Cited

U.S. PATENT DOCUMENTS

| | | | |
|---|---|---|---|
| 4,468,284 | * | 8/1984 | Nelson ................. 156/643 |
| 5,085,731 | * | 2/1992 | Norman et al. ................. 156/646 |
| 5,350,484 | * | 9/1994 | Gardner et al. ................. 156/628 |
| 5,736,002 | * | 4/1998 | Allen et al. ................. 156/628.1 |
| 5,939,334 | * | 8/1999 | Nguyen et al. ................. 438/689 |

OTHER PUBLICATIONS

Article entitled "Reaction of 1,1,1,5,5,5–Hexafluoro–2,4 pentanedione (H$^+$hfac) with CuO,Cu$_2$O, and Cu Films" by M.A. George, D.W. Hess, S.E. Beck, J.C. Ivandovits and D.A. Bohling published in J. Electrochem. Soc., vol. 142, No. 3, Mar. 1995, pp. 961–965.

* cited by examiner

Primary Examiner—Randy Gulakowski
Assistant Examiner—Yolanda E. Wilkins
(74) Attorney, Agent, or Firm—David C. Ripma; Matthew D. Rabdau; Scott C. Krieger

(57) ABSTRACT

A method is provided to clean the interior surfaces, and especially the wafer chuck, of a metal vapor deposition chamber. The method takes advantage of the fact that the chamber controls the introduction and removal of chemical atmospheres, and the temperature inside the chamber. The method first oxidizes the surface to be cleaned with an oxygen plasma, and then removes the oxide products as a vapor with the use of Hhfac. The oxidization is controlled through the use of oxygen atmosphere, temperature, and radio frequency power levels. In this manner, the wafer chuck is cleaned of deposition byproducts without disassembly of the chamber.

21 Claims, 2 Drawing Sheets

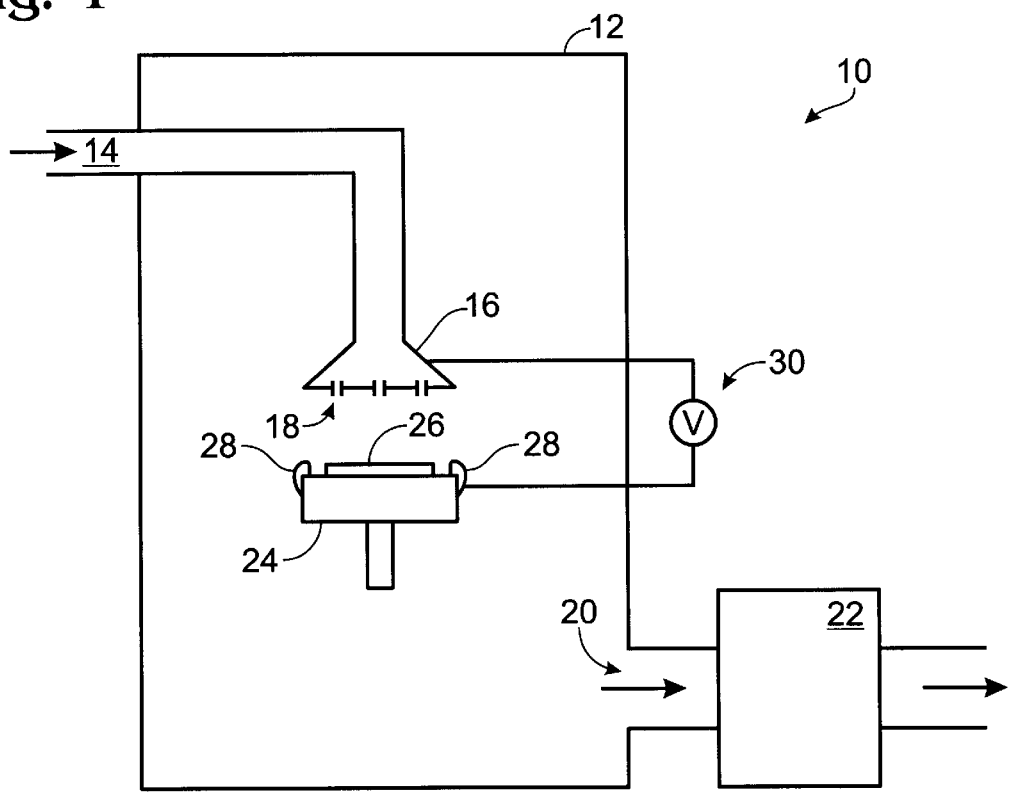
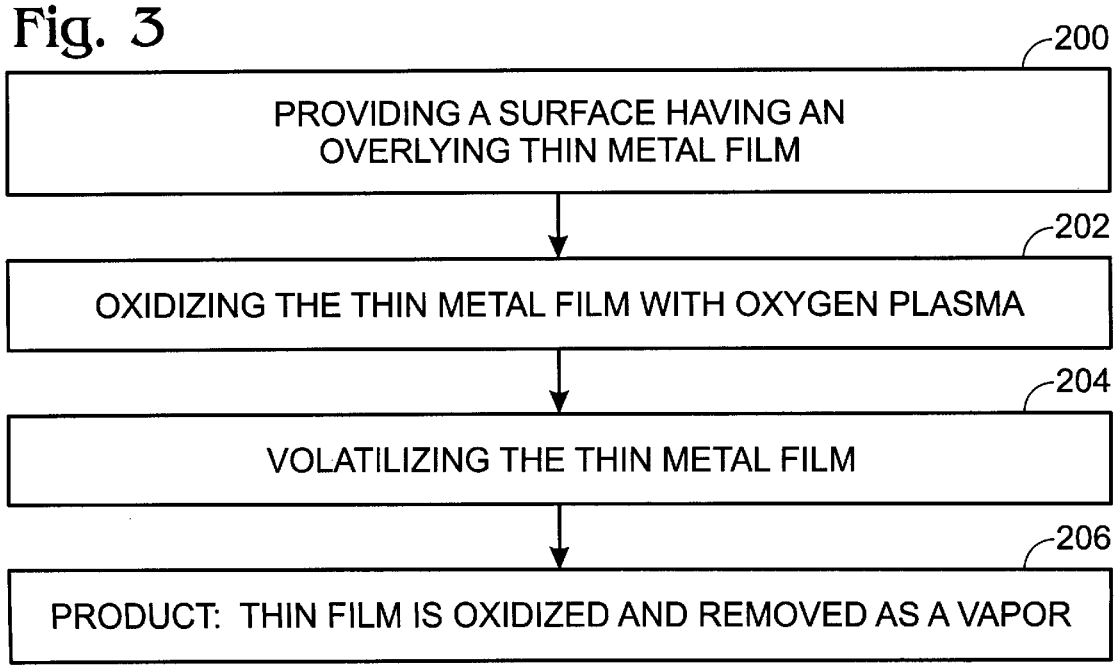

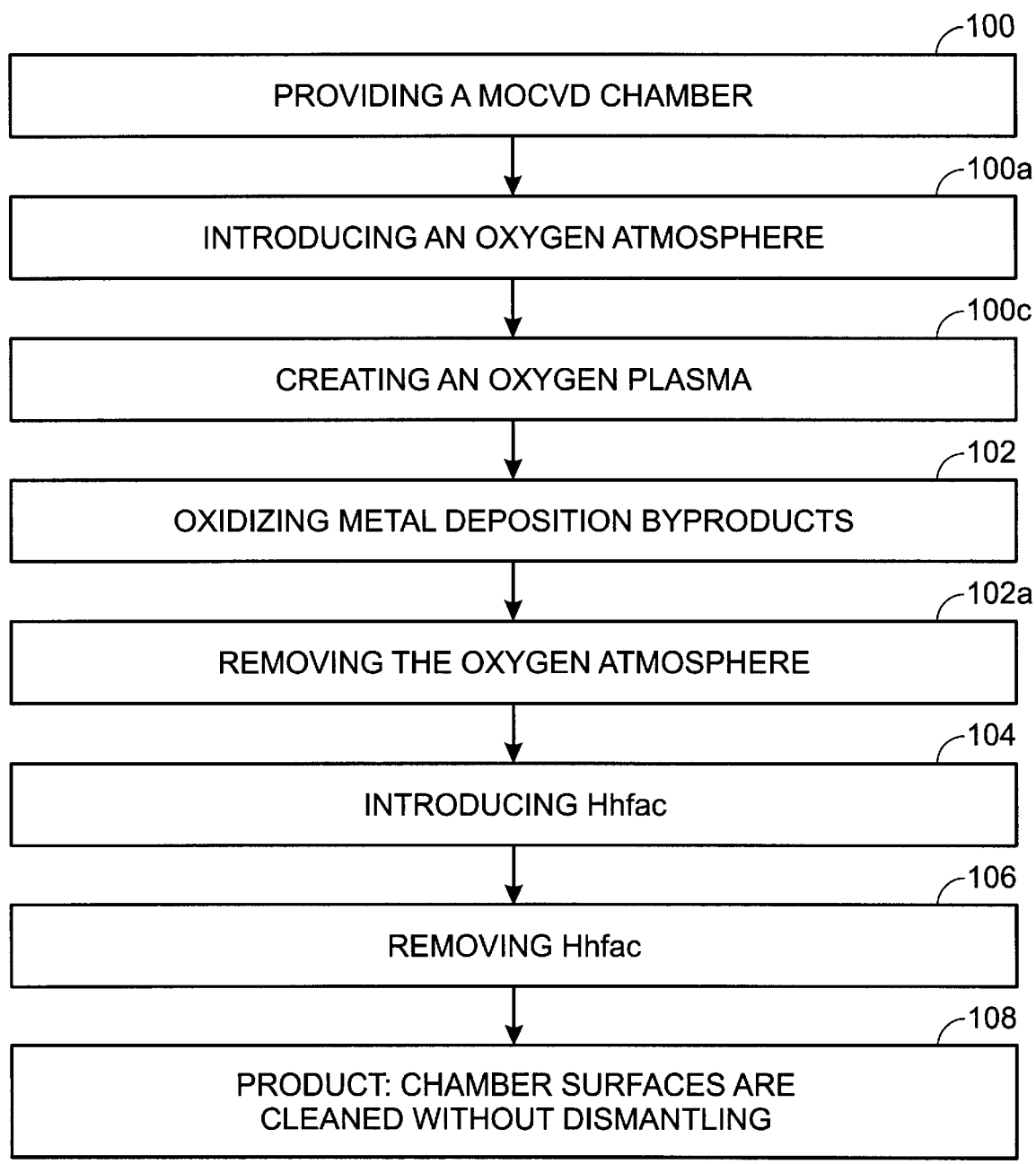

IN-SITU METHOD OF CLEANING A METAL-ORGANIC CHEMICAL VAPOR DEPOSITION CHAMBER

BACKGROUND AND SUMMARY OF THE INVENTION

This invention relates generally to integrated circuit (IC) processes and fabrication and, more particularly, to a method of maintaining the vessels used in the chemical vapor deposition of metals in forming metal levels and interconnection structures between metal levels in an IC substrate.

The demand for progressively smaller, less expensive, and more powerful electronic products, in turn, fuels the need for smaller geometry integrated circuits, and large substrates. It also creates a demand for a denser packaging of circuits onto IC substrates. The desire for smaller geometry IC circuits requires that the interconnections between components and dielectric layers be as small as possible. Therefore, research continues into reducing the width of via interconnects and connecting lines. The conductivity of the interconnects is reduced as the surface area of the interconnect is reduced, and the resulting increase in interconnect resistivity has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected, or from the joining of conductors having highly different impedance characteristics.

There is a need for interconnects and vias to have both low resistivity, and the ability to withstand volatile process environments. Aluminum and tungsten metals are often used in the production of integrated circuits for making interconnections, or vias, between electrically active areas. These metals are popular because they are easy to use in a production environment, unlike copper which requires special handling.

Copper (Cu) is a natural choice to replace aluminum in the effort to reduce the size of lines and vias in an electrical circuit. The conductivity of copper is approximately twice that of aluminum, and over three times that of tungsten. As a result, the same current can be carried through a copper line having half the width of an aluminum line.

The electromigration characteristics of copper are also much superior to those of aluminum. Aluminum is approximately ten times more susceptible than copper to degradation and breakage through electromigration. As a result, a copper line, even one having a much smaller cross-section than an aluminum line, is better able to maintain electrical integrity.

Metal cannot be deposited onto substrates, or into vias, using conventional metal deposition processes, such as sputtering, when the geometries of the selected IC features are small. It is impractical to sputter metal, either aluminum or copper, to fill small diameter vias, since the gap filling capability is poor. To deposit copper, various chemical vapor deposition (CVD) techniques are under development in the industry.

In a typical CVD process, the metal copper is combined with an organic ligand to make a volatile copper compound or metal-organic chemical vapor deposition (MOCVD) precursor. That is, copper is incorporated into a compound that is easily vaporized into a gas. Selected surfaces of an integrated circuit, such as diffusion barrier material, are exposed to the copper containing gas in an elevated temperature environment. When the volatile copper gas compound decomposes, copper is left behind on the heated selected surface. Several copper compounds are available for use with the CVD process. It is generally accepted that the molecular structure of the copper compound, at least partially, affects the conductivity of the copper film residue on the selected surface.

The metal-organic precursor used to deposit metal metals is typically introduced into an environmental chamber containing the target IC substrate surface. Control over the metal-organic vapor is a major process concern, with care taken to control the flow rates and precursor temperature. Some processes atomize the precursor, others vaporize the precursor, and the precursor is often mixed with a carrier gas. The IC substrate is mounted to a heated wafer chuck, and it is intended that the precursor vapor react with the heated substrate to decompose, leaving a solid metal film over the substrate. Unfortunately, the precursor may cover the chamber walls as a result of incomplete vaporization and, at least partially, decompose on these surfaces. One major problem in maintaining deposition chambers is that the precursors decompose on the heated chuck around the heated wafer substrate.

Tolerance differences between wafer substrates, and in the positioning of the wafers on the chuck sometimes makes it difficult to center a wafer, which in turn results in an uneven transfer of heat to the wafer and, ultimately, unequal metal deposition. A build-up of metal around the wafer can also result in bridging of deposition material around the wafer, and the wafer edges. Further, metal build-up on the chuck may cause a wafer to stick to the chuck after the deposition process. If the build-up flakes, the flaking material can lodge between the chuck and wafer, or can attach itself to the wafer surface.

Therefore, the wafer chuck, and other chamber surfaces, must be periodically cleaned of deposition byproducts and metal film build-up. A determination is made of the time it takes for a critical build-up to occur. A critical build-up, depending on the process, may be in the range from 10 to 1000 microns. Depending on the cycle, it may be necessary to clean a chamber on a weekly, daily, or even on a shift basis. Typically, a chamber is cleaned by disassembling the parts, such as the wafer chuck, and etching the parts with acid. A 2–4% maintenance budget against the overall time of use in IC processes is significant, and the cleaning process can take as long as an entire shift.

A co-pending application Ser. No. 08/717,267, filed Sep. 20, 1996, entitled, "Oxidized Diffusion Barrier Surface for the Adherence of Copper and Method for Same", invented by Nguyen et al., now U.S. Pat. No. 5,913,144, which is assigned to the same Assignees as the instant patent, discloses a method for oxidizing the diffusion barrier surface to improve the adherence of copper to a diffusion barrier. However, no disclosure is made for the removal of the oxidized surfaces, or the treatment of large scale surfaces.

Another co-pending application Ser. No. 08/729,567, filed Oct. 11, 1996, entitled, "Chemical Vapor Deposition of Copper on an ION Prepared Conductive Surface and Method for Same," invented by Nguyen and Maa, now U.S. Pat. No. 5,918,150, which is assigned to the same Assignees as the instant patent, discloses a method of preparing a conductive surface, such as a barrier layer, with an exposure to the ions of an inert gas and a reactive oxygen species to improve electrical conductivity between a conductive surface and a subsequent deposition of copper. However, the primary purpose of this invention is to prepare a conductive IC surface, not clean a MOCVD chamber surface.

George et al., in "Reaction of 1,1,1,5,5,5-Hexafluoro-2, 4-pentanedione (H+hfac) with CuO, $Cu_2O$, and Cu Films", in J. Electrochem. Soc., Vol. 142, No. 3, March 1995, generally discuss the use of Hhfac to etch copper. However, no explicit process to clean copper coated surfaces in an environmental chamber is disclosed.

It would be advantageous to employ a method of simplifying the cleaning of equipment used in MOCVD processes. It would likewise be advantageous if the cleaning time required could be reduced.

It would be advantageous to clean an MOCVD chamber of vapor deposited metal using gaseous atmospheres and processes similar to those used in the standard operation of the MOCVD chamber. It would be advantageous if the cleaning process could be adapted to pre-existing automated techniques.

It would be advantageous to remove vapor deposited metals from a MOCVD chamber without disassembly of the chamber or the dismantling and removing of the parts to be cleaned. It would be advantageous if the cleaning process could be carried out quickly, in small time gaps between other chamber processes.

Accordingly, a method is provided for removing a thin metal film from a surface. The method comprises the steps of:

a) oxidizing a thin metal film from the surface to be cleaned; and b) volatilizing the oxidized thin metal film created in Step a). That is, the thin metal film is oxidized, and then removed as a vapor. This process can be repeated for further removal of metal film on a surface.

In one aspect of the invention, a metal deposition chamber is provided to enclose the surface to be cleaned. Then, Step a) includes providing an oxygen atmosphere to further the oxidation process. Step b) includes providing a hydrolyzed hexafluoroacetylacetonate (Hhfac) atmosphere to volatilize the oxidized thin film. Step a) also includes heating the surface to be cleaned to further the oxidation process. In some aspect of the invention, the surface is heated to a temperature in the range between 100 and 500 degrees Celsius.

Oxidation is dependent upon a number factors such as the temperature or of the surface to be oxidized, the amount of oxygen in the atmosphere, and the specific type of oxygen bonding. These factors all influence the diffusion of oxygen molecules into the thin metal film to be oxidized. Typically, it is desirable to oxidize at least a thickness of 1,000 Angstroms from the metal film surface. However, in some process the oxygen levels in the atmosphere, or the time permitted for the oxidation process are varied to produce either thicker or thinner oxidation layers.

An oxygen plasma is provided to oxidize the thin metal film. That is, a radio frequency (RF) energy field is applied to create ions which impinge into the surface to be cleaned. The oxygen atmosphere and RF energy promote the oxidation process. Then, the ability of oxygen ions to diffuse into the thin metal surface makes the temperature of the surface to be cleaned and the amount of oxygen in the ambient air less critical.

Typically, the environmental chamber is designed for metal-organic chemical vapor deposition (MOCVD). During the vapor deposition processes, thin metal films tend to form on both intended and unintended surfaces, especially heated surfaces. Since the wafer chuck is used to heat the substrate upon which metal is being deposited, metal is also deposited on the wafer chuck. The present invention takes advantage of the control over the atmosphere and temperature on the chamber surfaces that are necessarily present in a typical vapor deposition chamber. That is, the environmental chamber is already designed to control the atmosphere introduced into the chemical vapor deposition chamber, and to control the temperature of the wafer chuck and other internal chamber surfaces. The present invention allows the wafer chuck to be cleaned of metal film accumulations through control of the atmosphere and temperature in the chamber. Therefore, the wafer chuck can be cleaned in the chamber; it need not be removed for cleaning.

BRIEF DESCRIPTION OF THE DRAWINGS

FIG. 1 illustrates an exemplary metal-organic chemical vapor deposition (MOCVD) system (prior art).

FIG. 2 is a flowchart illustrating the method for in-situ cleaning of metal deposition byproducts from surfaces.

FIG. 3 is a flowchart illustrating a method for cleaning a surface.

DETAILED DESCRIPTION OF THE PREFERRED EMBODIMENT

FIG. 1 illustrates an exemplary metal-organic chemical vapor deposition (MOCVD) system 10 (prior art). System 10 includes a chamber 12 to maintain and control the gaseous environment. Chamber 12 includes an inlet port 14 to introduce gases and atmospheres to chamber 12. In some aspects of the invention, a showerhead 16 is used to deliver the gases to the wafer surface. Showerhead 16 often has small outlet holes 18 to spray the input gases in a wider, more uniform distribution pattern. Chamber 12 also includes an outlet port 20 to exhaust and vent a gaseous atmosphere from chamber 12. An exhaust pump 24, operatively connected to outlet port 20, aids in the venting and removal of exhaust gases from chamber 12.

A wafer chuck 24 is typically included in system 10. Integrated circuits substrates 26 are mounted on wafer chuck 24, and thin films of metal are deposited on the substrates through a chemical deposition process. Wafer chuck 24 is heated to maintain the optimal temperature at IC substrate 26 for the deposition of metal on substrate 26.

Metal-organic vapor can penetrate between the surface of the wafer chuck and the IC substrate. Over repeated deposition processes, a thin film of metal 28 forms over the surface of wafer chuck 24. Thin film of metal 22 can interfere with the transfer heat from wafer chuck 20 to the IC substrate. Also, metal film 22 interferes with the mechanic placement of an IC substrate on wafer chuck 20. For this reason, wafer chuck 20 must be periodically cleaned. The present invention provides away of cleaned wafer chuck 20 without removing it from chamber 12.

A metal film can also build up on the chamber walls 24, even though the wall temperature is below optimal deposition temperatures. Further, the vaporization of metal deposition precursors is not always efficient. That is, some of the precursor may enter input port 14 as a liquid, and coat chamber walls 24 with a film of thin metal.

It is not uncommon for chamber 12 to be equipped with an electrical biasing system 30 operating at a radio frequency (RF), which breaks the bonds of molecules in the chamber atmosphere. Breaking the bonds typically creates a high flux density of charged particles, or plasma ions which are attracted to, and impinge into oppositely charged chuck surfaces 20. These ions often react chemically with a material mounted on wafer chuck 20. Alternately, the ions impart kinetic energy to the wafer mounted material. Regardless, metal bonds in the material are broken and the metal combines with oxygen molecules.

In one exemplary process, the RF frequency is 13.56 megahertz, at a power level in the range from 200 to 2000 watts for an eight inch diameter wafer chuck surface. The power is proportionally scaled for different sized chuck surfaces. Pure oxygen is used at a flow rate of 250 to 1000 cubic centimeters per minute, when cleaning an eight inch diameter surfaces. The flow rate is scaled proportional for different sized surfaces to be cleaned. In some aspects of the invention, water vapor, generated with a bubbler, is added to the oxygen. The chamber pressure is in the range from 1 milliTorr to 1 Torr.

FIG. 2 is a flowchart illustrating the method for in-situ cleaning of metal deposition byproducts from surfaces. These byproducts include metal unintentionally deposited on process equipment surfaces. Step 100 provides an environmental chamber for metal-organic chemical vapor deposition on integrated circuit surfaces. Step 102 oxidizes the metal deposition byproducts on the surface to be cleaned. Step 104 introduces hydrolyzed hexafluoroacetylacetonate (Hhfac) vapor into the chamber to volatilize the metal deposition byproducts oxidized in Step 102.

A metal such as copper is forms one of two oxides, CuO and $Cu_2O$. When Hhfac reacts with CuO, the following chemical reaction occurs:

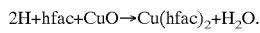

$$2H+hfac+CuO \rightarrow Cu(hfac)_2+H_2O.$$

When Hhfac reacts with $Cu_2O$, the following chemical reaction occurs:

$$2H+hfac+Cu_2O \rightarrow Cu+Cu(hfac)_2+H_2O.$$

Step 106 removes the metal deposition byproducts volatilized in Step 104. Step 108 is a product, where chamber surfaces are cleaned without disassembly or removal from the chamber.

In some aspects of the invention, further steps precede Step 102. Step 100a introduces an atmosphere including oxygen into the chamber. Step 100b (not shown) heats the chamber surface to be cleaned. The chamber surface is heated to a temperature in the range between 100 and 500 degrees Celsius. In this manner, the oxidation process of Step 102 is furthered. Typically, a further step follows Step 102, and proceeds Step 104. Step 102a establishes a vacuum to remove the oxygen atmosphere from the chamber. Step 106 includes creating a vacuum to remove the volatilized byproducts from the chamber.

In some aspects of the invention, other steps precede Step 102. Step 100c uses a RF energy to generate a high flux field, creating an oxygen plasma to further the oxidation process of Step 102.

Typically, the most important chamber surface to be cleaned is the wafer chuck upon which the IC substrates are mounted for vapor deposition. The metal film and metal film deposition byproducts to be removed from the wafer chuck surface are selected from the group consisting of tantalum, tungsten, titanium, and copper. Step 102 typically includes oxidizing the surface to be cleaned to a thickness of at least approximately 1,000 Angstroms. At increased temperatures and prolonged oxidation times, the thickness of the oxidation layer is increased, in some aspects of the invention. Alternately, temperatures and oxidation times are reduced to generate thinner oxidation thicknesses. The practical limit for depth of oxidation is approximately 1,000 Angstroms. When the metal film to be removed is thicker 1000 Å, it is often more cost effective to remove the material in steps, rather than oxidize for prolonged periods of time, higher chuck temperatures, or higher RF power levels. Then, Steps 102 through 104 are repeated a plurality of cycles until the proper thickness of material is removed.

In one aspect of the invention, a dry oxygen atmosphere is introduced into the chamber to promote oxidation of the surfaces to be cleaned. The dry oxygen atmosphere is relatively easy to vent and remove from the chamber. However, the addition of water, or water vapor to the oxygen atmosphere in the chamber to enhance the oxidation process. Therefore, in some aspects of the invention water is introduced to the chamber surface to be cleaned to further the oxidation process of step 102.

FIG. 3 is a flowchart illustrating a method for cleaning a surface. Step 200 provides a surface with an overlying thin metal film. Step 202 generates a high flux density of oxygen ions impinging and oxidizing the thin metal film from the surface to be claimed. Step 204 volatilizes the oxidized thin film byproducts created in Step 202. Step 206 is a product where the thin film is oxidized and then removed as a vapor. As described above, a metal vapor deposition chamber is typically provided to enclose the surface to be cleaned, and Step 202 includes providing oxygen atmosphere to further the oxidation process. In some aspects of the invention, the surface to be cleaned is a heated chuck surface in an environmental chamber. Step 202 includes heating the surface to a temperature in the range between 100 and 500 degrees Celsius.

Step 204 includes providing an Hhfac atmosphere to volatilize the oxidize then film. Step 202 provides an RF frequency of approximately 13.56 megahertz and a power level in the range from 200 to 2000 watts per 8 inch diameter surface to generate an oxygen plasma which oxidizes the thin metal film.

A method has been provided to clean the interior surfaces, and especially the wafer chuck, of a metal vapor deposition chamber. The method takes advantage of the fact that the chamber inherently has control over the introduction and removal of chemical atmospheres and the temperature inside the chamber. The method first oxidizes the surface to be cleaned, and then removes the oxide products as a vapor with the use of Hhfac. Other variations and embodiments of the inventions will occur to those skilled in the art.

What is claimed is:

1. A method of cleaning metal deposition byproducts from interior surfaces of a chemical vapor deposition (CVD) chamber, the method comprising the steps of:
   a) in a CVD chamber without an integrated circuit substrate positioned therein, oxidizing the metal deposition byproducts on the interior CVD chamber surfaces to be cleaned;
   b) introducing hydrolyzed hexafluoroacetylacetonate (Hhfac) vapor into the chamber to volatilize the metal deposition byproducts oxidized in Step a); and
   c) removing the metal deposition byproducts volatilized in Step b), whereby the interior surfaces of the CVD chamber are cleaned without disassembly of the chamber.

2. A method as in claim 1 including further steps, preceding Step a), of:
   introducing an atmosphere including oxygen into the chamber; and
   heating the chamber surface to be cleaned, whereby the oxidation process of Step a) is furthered.

3. A method as in claim 2 in which the step of heating the chamber surface includes heating the surface to be cleaned to a temperature in the range between 100 and 500 degrees Celsius.

4. A method as in claim 2 including a further step, preceding Step a), of:
   using RF energy to generate a high flux field, creating an oxygen plasma to further the oxidation process of Step a).

5. A method gas in claim 1 including a further step, following Step a), of:
   $b_1$) establishing a vacuum to remove the oxygen atmosphere from the chamber.

6. A method as in claim 1 in which Step c) includes creating a vacuum to remove the volatilized byproducts from the chamber.

7. A method as in claim 1 wherein the chamber surface to be cleaned is a wafer chuck.

8. A method as in claim 7 wherein the metal deposition byproducts to be removed includes a metal selected from the group consisting of tantalum, tungsten, titanium, and copper.

9. A method has in claim 1 including the a further step, preceding Step a) of:
   introducing water to the chamber surface to be cleaned, whereby the oxidation process of Step a) is enhanced.

10. A method as in claim 1 in which Step a) includes oxidizing the surface to be cleaned to a thickness of at least approximately 1,000 Angstroms.

11. In an environmental chamber for metal-organic chemical vapor deposition (MOCVD) on Integrated Circuit (IC) surfaces, a method for in-situ cleaning of metal deposition byproducts from a wafer chuck surface, the method comprising the steps of:
   a) introducing an atmosphere including oxygen into the chamber to oxidize the metal deposition byproducts on the heated surface;
   b) establishing a vacuum in the chamber to remove the oxygen atmosphere introduced in Step a);
   c) introducing hydrolyzed hexafluoroacetylacetonate (Hhfac) vapor into the chamber to volatilize the metal deposition byproducts oxidized in Step a); and
   d) establishing a vacuum in the chamber to remove the metal deposition byproducts volatilized in Step a), whereby wafer chuck surfaces are cleaned without disassembly of the chamber.

12. A method as in in claim 11 including a further step, preceding Step a), of:
   heating the wafer chuck surface to a temperature in the range between 100 and 500 degrees Celsius, whereby the oxidation process of Step a) is furthered.

13. A method as in claim 11 wherein the metal deposition byproducts to be removed are selected from the group consisting of tantalum, tungsten, titanium, and copper.

14. A method as in claim 11 including a further step, preceding Step a), of:
   introducing water to the chamber surface to be cleaned, whereby the oxidation of process of Step a) is enhanced.

15. A method as in claim 11 in which Step a) includes oxidizing the wafer chuck surface to be cleaned to a thickness of at least approximately 1,000 Angstroms.

16. A method as in claim 11 in which Step a) including using energy at a radio frequency to generate oxygen ions impinging the chuck surface to further the oxidation of the chuck surface.

17. A method for cleaning a thin metal film from a surface comprising the steps of:
   a) generating a high flux density of oxygen ions impinging and oxidizing the thin metal film from the surface to be cleaned; and
   b) volatilize the oxidized thin film byproducts created in Step a), whereby the thin metal film is oxidized and, then, removed as a vapor.

18. A method as in claim 17 wherein an environmental chamber is provided to enclose the surface to be cleaned, in which Step a) includes providing an oxygen atmosphere to further the oxidation process, and in which Step b) includes providing a hydrolyzed hexafluoroacetylacetonate (Hhfac) atmosphere to volatilize the oxidized thin film.

19. A method as in claim 18 wherein the surface to be cleaned is a heated chuck inside the environmental chamber, and in which Step a) includes heating the surface to be cleaned to further the oxidation process.

20. A method as in claim 19 in which Step a) includes heating the surface to a temperature in the range between 100 and 500 degrees Celsius.

21. A method as in claim 16 wherein an environmental chamber is provided to enclose the surface to be cleaned, in which Step a) includes providing a RF frequency of 13.56 megahertz and a power level in the range from 200 to 2000 watts per 8 inch diameter surface to generate an oxygen plasma which oxidizes the thin metal film.

* * * * *